United States Patent
Otsuka et al.

(10) Patent No.: US 6,654,299 B2
(45) Date of Patent: Nov. 25, 2003

(54) SEMICONDUCTOR DEVICE

(75) Inventors: Hidefumi Otsuka, Osaka (JP); Tomonori Fujimoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/921,564

(22) Filed: Aug. 6, 2001

(65) Prior Publication Data

US 2001/0043500 A1 Nov. 22, 2001

Related U.S. Application Data

(62) Division of application No. 09/449,566, filed on Nov. 29, 1999, now Pat. No. 6,295,243.

(30) Foreign Application Priority Data

Nov. 30, 1998 (JP) .......................................... 10-338940

(51) Int. Cl.⁷ ................................................ G11C 7/00
(52) U.S. Cl. .................. 365/201; 365/222; 365/189.03
(58) Field of Search ....................... 365/189.01, 189.03, 365/201, 222, 230.01

(56) References Cited

U.S. PATENT DOCUMENTS

| 4,380,805 A | 4/1983 | Proebsting |
| 4,724,531 A | 2/1988 | Angleton et al. ........... 365/181 |
| 5,313,424 A | 5/1994 | Adams et al. .............. 365/200 |
| 5,583,817 A | 12/1996 | Kawaguchi et al. ........ 365/201 |
| 5,619,470 A | 4/1997 | Fukumoto |
| 5,629,898 A | 5/1997 | Tolei et al. |
| 5,708,622 A | 1/1998 | Ohtani et al. |
| 5,774,409 A | 6/1998 | Yamazaki et al. |
| 5,796,669 A | 8/1998 | Araki et al. |
| 5,835,448 A | 11/1998 | Ohtani et al. |
| 5,940,342 A | 8/1999 | Yamazaki et al. |
| 6,005,818 A | 12/1999 | Ferrant |
| 6,009,036 A | 12/1999 | Takasugi |
| 6,065,143 A * | 5/2000 | Yamasaki et al. ............ 714/720 |
| 6,081,910 A * | 6/2000 | Mifsud et al. ............... 714/718 |
| 6,119,049 A * | 9/2000 | Peddle ......................... 700/121 |
| 6,175,529 B1 * | 1/2001 | Otsuka et al. ............... 365/201 |
| 6,215,714 B1 | 4/2001 | Takemae et al. |
| 6,222,785 B1 | 4/2001 | Leung |

FOREIGN PATENT DOCUMENTS

| JP | 404022887 A | 1/1992 | |
| JP | 408313591 A * | 11/1996 | |
| JP | 409082088 A | 3/1997 | |
| JP | 411260096 A * | 9/1999 | |
| JP | 411316259 A | 11/1999 | ........... G01R/31/28 |
| JP | 02000091388 A * | 3/2000 | |
| JP | 02000195288 A | 7/2000 | ........... G11C/29/00 |
| JP | 2001155500 A | 6/2001 | ........... G11C/29/00 |

* cited by examiner

*Primary Examiner*—Viet Q. Nguyen
(74) *Attorney, Agent, or Firm*—McDermott, Will & Emery

(57) ABSTRACT

A semiconductor integrated circuit includes a plurality of semiconductor memory devices implemented as DRAMs and an output selector on the same chip. External terminals of the chip include: terminals for inputting an inverted row address strobe signal /RAS to the respective semiconductor memory devices individually; and common terminals for inputting PRAUT, SLF, /CAS, ADR, /WE, /OE, CLK and TMODE signals to all the memory devices. The output signals TDQ, SRAS, MOUT and BITST of the semiconductor memory devices are controlled by the output selector, passed through a common test bus and then output from a common external terminal.

6 Claims, 13 Drawing Sheets

SEMICONDUCTOR DEVICE

This application is a division of application Ser. No. 09/449,566 filed on Nov. 29, 1999, now U.S. Pat. No. 6,295,243.

BACKGROUND OF THE INVENTION

The present invention relates to a semiconductor device as a single-chip implementation of dynamic random access memories (DRAMs) and logic circuits integrated together.

Thanks to recent tremendous increase in the number of, or the density per unit area of, components included within a single semiconductor integrated circuit, a so-called "system LSI", that is, an LSI with a multiplicity of functional blocks integrated together within a single chip, has become widespread in the art. Among other things, a hybrid LSI, or a single-chip implementation of large-scale logic circuits and DRAMs integrated together, has attracted great attention. A hybrid LSI including a plurality of built-in DRAMs, each performing an equivalent function expected from a conventional general-purpose DRAM, has already been put on the market.

If a number of DRAMs are integrated together on a single chip in this way, then external pins, which have been used as test terminals connected to a general-purpose DRAM, are no longer necessary. That is to say, the number of external terminals applicable to testing each of these DRAMs on a single chip is now limited. Thus, in testing these DRAMs, the number of terminals needed to test each of them should be reduced in some way or other. For example, according to a technique, these DRAMs are serially tested in a time-sharing manner. Alternatively or additionally, the DRAMs are tested while sharing as large a number of external test terminals as possible.

FIG. 13 illustrates an exemplary test scheme applicable to testing each one of DRAMs integrated on a single chip to make up a semiconductor integrated circuit.

Generally speaking, a DRAM usually performs automatic and self-refresh test functions. Thus, the test scheme illustrated in FIG. 13 is supposed to test a semiconductor integrated circuit with these two test functions.

In this specification, the "auto refresh test function" means refreshing data stored in each memory cell within a DRAM by accessing the memory cell automatically. More specifically, the memory cell is accessed by periodically inputting a rectangular wave through a particular input terminal (i.e., an auto refresh input terminal) and getting a row address generated by an address counter within the DRAM (i.e., a refresh counter) responsive to the input wave.

The "self-refresh test function" also means refreshing data stored in each memory cell within a DRAM by accessing the memory cell. More specifically, the memory cell is accessed responsive to a periodic wave (i.e., a row address sync signal) generated by an oscillator within the DRAM with the level of a self-refresh signal received at a particular input terminal (i.e., a self-refresh input terminal) fixed at the "H" or "L" level.

As shown in FIG. 13, a test scheme is provided to test a plurality of semiconductor memory deices 250A, 250B, ..., 250X (i.e., DRAMs) included within a conventional semiconductor integrated circuit 200. Each of these semiconductor memory devices 250 includes a set of nine input terminals 201, 202, 203, 204, 205, 206, 207, 208 and 209. Specifically, an inverted row address strobe signal /RAS (i.e., a signal provided to test the operation of the DRAM) is received at the input terminal 201. An auto refresh test control signal PRAUT is received at the input terminal 202. A self-refresh test control signal SLF is received at the input terminal 203. An inverted column address strobe signal /CAS is received at the input terminal 204. An address ADR is received at the input terminal 205. An inverted write enable signal /WE is received at the input terminal 206. An inverted output enable signal /OE is received at the input terminal 207. A clock signal CLK is received at the input terminal 208. And a test control signal TEST is received at the input terminal 209. The test control signal TEST is provided to determine whether a burn-in test or an ordinary DRAM test should be performed.

On the other hand, the chip, or the semiconductor integrated circuit 200, includes a set of external terminals 211, 212, 213, 214, 215, 216, 217, 218 and 219 for inputting these signals therethrough. Specifically, the external terminals 211A, 211B, ..., 211X are provided for inputting the inverted row address strobe signal /RAS to the individual semiconductor memory devices 250A through 250X, respectively. The external terminals 212A, 212B, ..., 212X are provided for inputting the auto refresh test control signal PRAUT to the individual semiconductor memory devices 250A through 250X, respectively. The external terminal 213 is provided for inputting the self-refresh test control signal SLF in common to all the semiconductor memory devices 250A through 250X. The external terminal 214 is provided for inputting the inverted column address strobe signal /CAS in common to all the semiconductor memory devices 250A through 250X. The external terminal 215 is provided for inputting the address ADR in common to all the semiconductor memory devices 250A through 250X. The external terminal 216 is provided for inputting the inverted write enable signal /WE in common to all the semiconductor memory devices 250A through 250X. The external terminal 217 is provided for inputting the inverted output enable signal /OE in common to all the semiconductor memory devices 250A through 250X. The external terminal 218 is provided for inputting the clock signal CLK in common to all the semiconductor memory devices 250A through 250X. And the external terminal 219 is provided for inputting the test control signal TEST in common to all the semiconductor memory devices 250A through 250X.

That is to say, in this arrangement, the total number of external terminals is minimized by connecting the set of input terminals 203 through 209 in each of the semiconductor memory devices 250A through 250X to the respective common external terminals 213 through 219.

In addition, each of these semiconductor memory devices 250A through 250X includes a test data (TDQ) input/output terminal 221.

On the output end of the semiconductor integrated circuit 200, the test data input/output terminals 221 of all the semiconductor memory devices 250A through 250X are connected in common to a single set of external terminals 231 through an input/output bus 241.

On the input end of the semiconductor integrated circuit 200 provided with such a test scheme, when the inverted row address strobe signal /RAS is asserted (e.g., falls to the "L" level), an associated DRAM is activated. When the signal /RAS is negated (e.g., rises to the "H" level), the associated DRAM enters a standby mode. Accordingly, if the DRAMs are serially tested one by one in a time-sharing fashion, then the number of terminals needed for testing can be cut down by taking advantage of this function. That is to say, as shown in FIG. 13, the dedicated inverted row address strobe signal external terminals 211A through 211X are provided for the DRAMs 250A through 250X, respectively. And a test is carried out by asserting only the inverted row address strobe signal /RAS associated with the DRAM under test while negating the inverted row address strobe signals /RAS associated with the other DRAMs. In such a case, the external terminals 213 through 219 for inputting the signals other than the inverted row address strobe signal /RAS and the auto refresh test control signal PRAUT can be shared among all the semiconductor memory devices 250A through 250X.

Also, when the inverted row address strobe signal /RAS is negated, the associated DRAM comes to have a high impedance HIZ. Thus, on the output end of the semiconductor integrated circuit 200, only a DRAM associated with an asserted inverted row address strobe signal /RAS is accessed through the test data input/output bus 241. Accordingly, the external terminal 231 for the test data input/output bus 241 can also be used in common.

Thus, just one set of external terminals 231 connected to the test data input/output bus 241 is required on the output end of the semiconductor integrated circuit 200. For example, when the bit width of the bus 241 is 8 bits, only a set of eight external terminals 231 is needed.

As can be seen, according to the test scheme shown in FIG. 13, it is possible to considerably reduce the number of external terminals needed to test the semiconductor integrated circuit 200 including the semiconductor memory devices (DRAMs) 250A through 250X.

On its input end, however, the conventional semiconductor integrated circuit 200 requires the same number of external terminals 212A through 212X for auto refresh test control signals as that of the DRAMs integrated on the single chip. Accordingly, the number of terminals needed for a test cannot be minimized. Also, as the case may be, a required minimum number of terminals cannot be ensured in carrying out a test.

Nevertheless, if the auto refresh test control signal PRAUT is input through a common external terminal, then all the DRAMs are refreshed automatically at a time and therefore it takes a very long time to finish the test. In addition, while the auto refresh function of a DRAM is being tested, no other DRAM can be tested for other items.

Thus, in the arrangement shown in FIG. 13, the individual external terminals 212A through 212X are provided for the auto refresh test control signal PRAUT. In this manner, even while a DRAM is being tested for a certain item other than auto refresh, any other DRAM can be automatically refreshed in the prescribed access order.

Also, since the common test data input/output bus 241 is applied to all the DRAMs (i.e., semiconductor memory devices) 250A through 250X, the bus 241 is floating (at an intermediate potential level) during a normal operation of the integrated circuit 200, i.e., when the bus 241 is not used. Accordingly, if the bus 241 is connected to p- and n-channel MOSFETs of a CMOS inverter, for example, then these MOSFETs might be both turned ON and a feedthrough current might possibly flow.

SUMMARY OF THE INVENTION

An object of the present invention is cutting down the number of terminals required for testing and so on by getting all the DRAMs integrated on the same chip automatically refreshed independently even if a single auto refresh control signal terminal is shared among the DRAMs.

Another object of the present invention is sharing as many terminals as possible, which are connected to other terminals newly provided for a DRAM.

A first exemplary semiconductor device according to the present invention includes a plurality of DRAMs and logic circuits integrated together on a single semiconductor substrate. Each said DRAM includes a plurality of memory cells. The semiconductor device further includes a plurality of first terminals and a single second terminal. Each said first terminal independently provides a corresponding row address strobe signal to associated one of the DRAMs. The second terminal receives an auto refresh control signal for all the memory cells in the respective DRAMs. The semiconductor device further includes means for selectively generating an internal auto refresh control signal or an internal row address strobe signal from the corresponding row address strobe signal depending on whether the auto refresh control signal is asserted or negated. The generating means is provided for each said DRAM and connected to associated one of the first terminals and to the second terminal.

According to the first semiconductor device, an operation requiring a row address strobe signal (i.e., a signal applied to select a row address) and an auto refresh operation not requiring the row address can be performed in a time-sharing fashion. As a result, the test time can be shortened just like a conventional semiconductor memory device. In addition, since the second terminal receiving the auto refresh control signal is sharable among all the DRAMs, the number of terminals required can be cut down.

A second exemplary semiconductor device according to the present invention also includes a plurality of DRAMs and logic circuits integrated together on a single semiconductor substrate. Each said DRAM includes a plurality of memory cells and generates a self-refresh row address strobe signal to access a desired one of the memory cells responsive to a self-refresh control signal. The semiconductor device further includes: a data bus for inputting or outputting data to/from the DRAMs therethrough; and means for selectively outputting the self-refresh row address strobe signal to the data bus.

In the second semiconductor device, even if the self-refresh row address strobe signal should be generated independently for the respective DRAMs, there is no need to provide an additional output terminal for that purpose.

In one embodiment of the present invention, the data bus may be connected in common to the DRAMs, and the outputting means may output the self-refresh row address strobe signal associated with one of the DRAMs through a one-bit-equivalent signal line of the data bus.

A third exemplary semiconductor device according to the present invention includes a plurality of DRAMs and logic circuits integrated together on a single semiconductor substrate. Each said DRAM includes a plurality of memory cells and internally generates a pass/fail flag signal representing a test result. The semiconductor device further includes: a data bus for inputting or outputting data to/from the DRAMs therethrough; and means for selectively outputting the pass/fail flag signal to the data bus.

In one embodiment of the present invention, the pass/fail flag signal may represent a result of a burn-in test.

In another embodiment of the present invention, the data bus may be connected in common to the DRAMs, and the outputting means may output the pass/fail flag signal associated with one of the DRAMs through a one-bit-equivalent signal line of the data bus.

DESCRIPTION OF THE PREFERRED EMBODIMENTS

Hereinafter, preferred embodiments of a semiconductor integrated circuit according to the present invention will be described with reference to the accompanying drawings.

Figure 1:
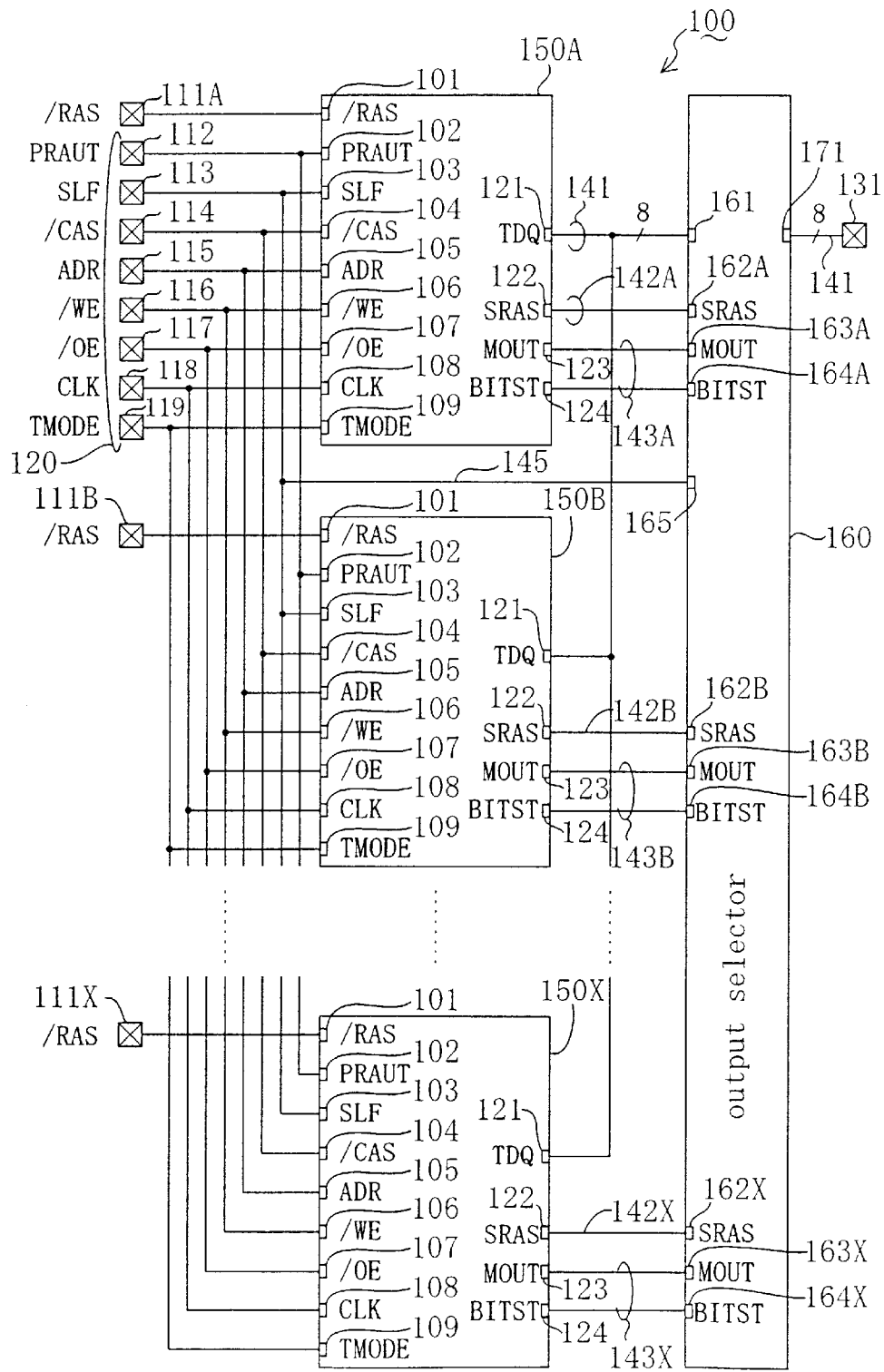
FIG. 1 is a block diagram schematically illustrating a test scheme for a semiconductor integrated circuit according to the present invention.

FIG. 1 schematically illustrates a test scheme for a semiconductor integrated circuit 100 according to an exemplary embodiment of the present invention. As shown in FIG. 1, the semiconductor integrated circuit 100 includes a plurality of semiconductor memory devices 150A, 150B, ..., 150X implemented as DRAMs and an output selector 160 in addition to logic circuits not shown in FIG. 1. Each of these semiconductor memory devices 150 includes a set of nine input terminals 101, 102, 103, 104, 105, 106, 107, 108 and 109. Specifically, an inverted row address strobe signal /RAS (i.e., a signal applied to test the operation of the DRAM) is received at the input terminal 101. An auto refresh test control signal PRAUT is received at the input terminal 102. A self-refresh test control signal SLF is received at the input terminal 103. An inverted column address strobe signal /CAS is received at the input terminal 104. An address ADR is received at the input terminal 105. An inverted write enable signal /WE is received at the input terminal 106. An inverted output enable signal /OE is received at the input terminal 107. A clock signal CLK is received at the input terminal 108. And a test mode control signal TMODE is received at the input terminal 109. The function of the test mode control signal TMODE will be described later.

On the other hand, the chip, or the semiconductor integrated circuit 100, includes a set of external terminals 111, 112, 113, 114, 115, 116, 117, 118 and 119 for inputting these signals therethrough. Specifically, the external terminals 111A through 111X are provided for inputting the inverted row address strobe signal /RAS to the individual semiconductor memory devices 150A through 150X, respectively. The external terminal 112 is provided for inputting the auto refresh test control signal PRAUT in common to all the semiconductor memory devices 150A through 150X. The external terminal 113 is provided for inputting the self-refresh test control signal SLF in common to all the semiconductor memory devices 150A through 150X. The external terminal 114 is provided for inputting the inverted column address strobe signal /CAS in common to all the semiconductor memory devices 150A through 150X. The external terminal 115 is provided for inputting the address ADR in common to all the semiconductor memory devices 150A through 150X. The external terminal 116 is provided for inputting the inverted write enable signal /WE in common to all the semiconductor memory devices 150A through 150X. The external terminal 117 is provided for inputting the inverted output enable signal /OE in common to all the semiconductor memory devices 150A through 150X. The external terminal 118 is provided for inputting the clock signal CLK in common to all the semiconductor memory devices 150A through 150X. And the external terminal 119 is provided for inputting the test mode control signal TEST in common to all the semiconductor memory devices 150A through 150X.

That is to say, in this arrangement, the total number of external terminals is minimized by connecting the set of input terminals 102 through 109 in each of the semiconductor memory devices 150A through 150X to the respective common external terminals 112 through 119.

Each of the semiconductor memory devices 150A through 150X includes: a test data (TDQ) input/output terminal 121; and respective output terminals 122, 123 and 124 for outputting a self-refresh test signal SRAS, a pass/fail flag MOUT and a burn-in test mode signal BITST. The pass/fail flag MOUT is a signal representing a result of a burn-in test.

The output selector 160 includes: a single test data terminal 161; the same number of self-refresh test terminals 162A through 162X and burn-in test terminals 163A through 163X and 164A through 164X as the number of the semiconductor memory devices 150A through 150X; and a single self-refresh test terminal 165. The test data TDQ output from all the semiconductor memory devices 150A through 150X is received at the single test data terminal 161. The self-refresh test signals SRAS output from the semiconductor memory devices 150A through 150X are received at the self-refresh test terminals 162A through 162X, respectively. The burn-in test mode signals BITST output from the semiconductor memory devices 150A through 150X are received at the burn-in test terminals 163A through 163X, respectively. The burn-in test mode signals BITST are sent back to the semiconductor memory devices 150A through 150X through the burn-in test terminals 164A through 164X, respectively. The self-refresh test control signal SLF is received at the self-refresh test terminal 165.

That is to say, the test data input/output terminals 121 of the respective semiconductor memory devices 150A through 150X are connected to the single test data terminal 161 through a common 8-bit test bus 141. The self-refresh test output terminals 122 of the semiconductor memory devices 150A through 150X are respectively connected to associated self-refresh test terminals 162A through 162X through independent signal lines 142A through 142X. The burn-in test output terminals 123 and 124 of the semiconductor memory devices 150A through 150X are respectively connected to associated burn-in test terminals 163A through 163X and 164A through 164X through independent burn-in test buses 143A through 143X. And the self-refresh test external terminal 113 on the input end of the semiconductor integrated circuit 100 is directly connected to the self-refresh test terminal 165 of the output selector 160 after having bypassed the respective semiconductor memory devices 150A through 150X by way of a bypass signal line 145. In the illustrated embodiment, the bit width of the test bus 141 is supposed to be 8 bits, but may be defined at any other number of bits.

On the output end of the output selector 160, just a single set of test data terminals 171 is provided for outputting the test data TDQ therethrough. The test data terminal set 171 is connected to a single set of test data external terminals 131 through the 8-bit test bus 141. In other words, the output selector 160 is inserted into the test bus 141. The output selector 160 is provided to use the set of test data external terminals 131 (i.e., exemplary I/O terminals) in common when the number of the semiconductor memory devices 150A through 150X on the single chip is eight or less. That is to say, the output selector 160 is provided to set the number of terminals included in the test data external terminal set 131 equal to the number of signal lines included in the test bus 141 at eight.

As can be seen, the primary feature of the semiconductor integrated circuit 100 according to the present invention is using the same external terminal 112 in common for inputting the auto refresh test control signal PRAUT to all the semiconductor memory devices 150A through 150X. By using the single external terminal 112 for the auto refresh test control signal in this manner, the number of external terminals required for testing can be considerably cut down. As a result, an external test terminal can always be secured for a system LSI including a plurality of DRAMs on a single chip.

A second feature of the semiconductor integrated circuit 100 according to the present invention lies in that even when each of the semiconductor memory devices 150A through 150X can independently perform the burn-in or self-refresh test function, a signal representing a test result and the refresh row address strobe signal are output through the test bus 141.

In this manner, the number of external terminals can be reduced while additionally providing various types of test functions for the integrated circuit.

Hereinafter, it will be described in detail how the respective components of the integrated circuit should be constructed to attain these effects of the present invention.

Figure 2:
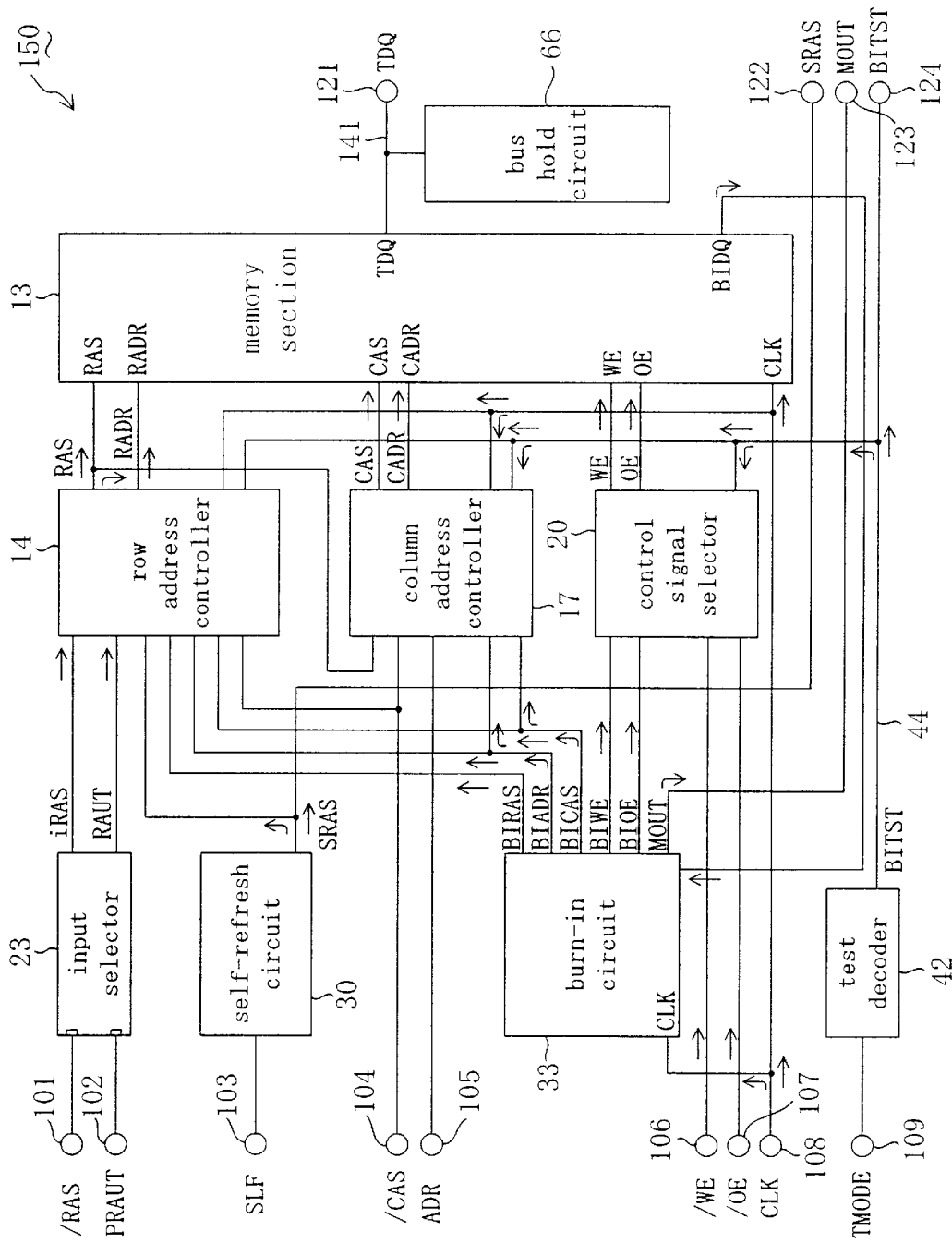
FIG. 2 is a block diagram illustrating a configuration for a semiconductor memory device in the semiconductor integrated circuit according to the present invention.

FIG. 2 illustrates an internal configuration of each semiconductor memory device 150 shown in FIG. 1. As shown in FIG. 2, the semiconductor memory device 150 includes: memory section 13; row address controller 14; column address controller 17; control signal selector 20; input selector 23; self-refresh circuit 30; burn-in circuit 33; and test decoder 42. The memory section 13 includes an array of memory cells and its peripheral circuitry. The row and column address controllers 14 and 17 control the operations concerning the selection of row and column addresses at the memory section 13, respectively. The control signal selector 20 is provided to switch modes of operation, e.g., read, write and other operations. The structures and functions of these circuits will be detailed below.

In the memory section 13, a plurality of memory cells, which should be refreshed to store data thereon, and peripheral circuitry needed to operate the memory cells are provided. To see if the memory device operates normally as a DRAM, a row address RADR and a row address strobe signal RAS are input from the row address controller 14 to the memory section 13. A column address CADR and a column address strobe signal CAS are also input from the column address controller 17 to the memory section 13. A write enable signal WE and an output enable signal OE are further input from the control signal selector 20 to the memory section 13. The memory section 13 is connected to the test data input/output terminal 121 through the test bus 141, through which the test data TDQ to be written or read out is input or output. A bus hold circuit 66 is connected to the test bus 141. A detailed structure of the bus hold circuit 66 will be described later.

The input selector 23 is connected to the test data input terminals of the associated semiconductor memory device 150A, 150B, or 150X, i.e., the input terminals 101 and 102 receiving the inverted row address strobe signal /RAS and the auto refresh test control signal PRAUT. The input selector 23 outputs an internal RAS signal iRAS or an internal auto refresh signal RAUT to the row address controller 14. Specifically, responsive to the auto refresh test control signal PRAUT, the input selector 23 selectively outputs the inverted row address strobe signal /RAS as either the internal RAS signal iRAS or the internal auto refresh signal RAUT. In other words, the input selector 23 generates both the internal RAS signal iRAS and the internal auto refresh signal RAUT from the inverted row address strobe signal /RAS.

Figure 13:
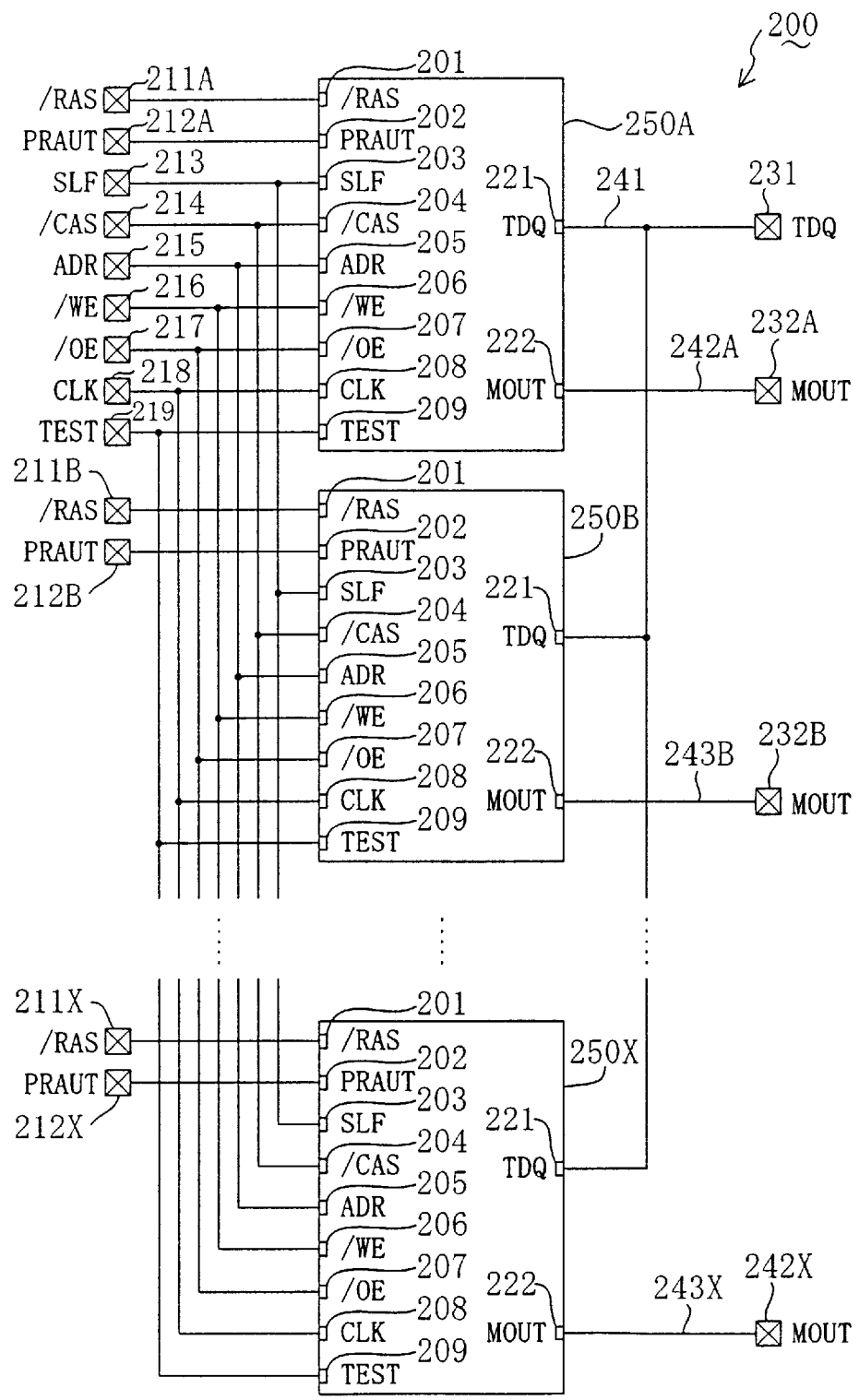
FIG. 13 is a block diagram schematically illustrating a test scheme for a conventional semiconductor integrated circuit including a multiplicity of semiconductor memory devices integrated together.

That is to say, while the auto refresh test control signal PRAUT is asserted at the "H" level, the internal auto refresh signal RAUT is generated and input only to one of the semiconductor memory devices 150A through 150X where the inverted row address strobe signal /RAS has been asserted at the "L" level. As a result, the auto refresh test can be carried out on the semiconductor memory device. On the other hand, while the auto refresh test control signal PRAUT is negated at the "L" level, the internal RAS signal iRAS is generated and input only to one of the semiconductor memory devices 150A through 150X where the inverted row address strobe signal /RAS has been asserted at the "L" level. Accordingly, the semiconductor memory devices 150A through 150X may be subjected to the auto refresh test and any other test requiring the access to the device in question in a time-sharing manner just like the conventional semiconductor integrated circuit shown in FIG. 13. In this case, no address strobe signals are needed to perform the auto refresh test. Rather, it is only necessary to apply the auto refresh testing voltage to all the memory cells in a predetermined order and read out the test data from all the memory cells. A test requiring the inverted row address strobe signal /RAS and the auto refresh test not requiring the signal /RAS to be negated can be performed in parallel on the semiconductor memory devices 150A through 150X. Thus, there is no need to provide the auto refresh test control signals independently to the respective semiconductor memory devices 150A through 150X.

Accordingly, the single auto refresh test control signal PRAUT is applicable to all the semiconductor memory devices 150A through 150X integrated on the same chip. As a result, the number of external terminals required for testing can be reduced.

Figure 3:
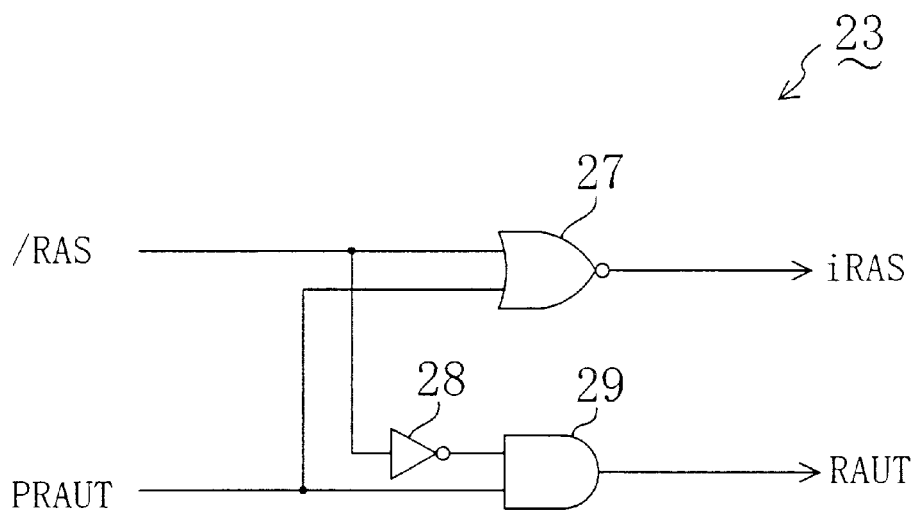
FIG. 3 is an electric circuit diagram illustrating a configuration for an input selector in the semiconductor memory device according to the present invention.

FIG. 3 illustrates a specific configuration of the input selector 23. As shown in FIG. 3, the input selector 23 includes a NOR gate 27, an inverter 28 and an AND gate 29. Responsive to the inverted row address strobe signal /RAS and auto refresh test control signal PRAUT, the NOR gate 27 outputs the internal RAS signal iRAS. The inverter 28 inverts the inverted row address strobe signal /RAS. Responsive to the inverted version of the inverted row address strobe signal RAS and the auto refresh test control signal PRAUT, the AND gate 29 outputs the internal auto refresh signal RAUT. In input selector 23, if the auto refresh test control signal PRAUT is asserted at the "H" level, then the inverted version of the inverted row address strobe signal /RAS is output as the internal auto refresh signal RAUT, while the internal RAS signal iRAS is negated at the "L" level. On the other hand, if the auto refresh test control signal PRAUT is negated at the "L" level, then the inverted version of the inverted row address strobe signal /RAS is output as the internal RAS signal iRAS, while the internal auto refresh signal RAUT is negated at the "L" level. That is to say, depending on whether the auto refresh test control signal PRAUT is asserted or negated, either the internal RAS signal iRAS or the internal auto refresh signal RAUT is generated responsive to the inverted row address strobe signal /RAS. Accordingly, even if the external terminal 112 receiving the auto refresh test control signal PRAUT is shared among all the semiconductor memory devices 150A through 150X integrated on the same chip, these devices 150A through 150X can be automatically refreshed without increasing the time taken to perform the auto refresh.

In the configuration illustrated in FIG. 1, the external terminal 112 receiving the auto refresh test control signal PRAUT is provided separately from the external terminal 113 receiving the self-refresh test control signal SLF. Alternatively, these external terminals 112 and 113 may be replaced with a single multi-purpose terminal. In such a case, the auto refresh and self-refresh tests may be selectively performed within the semiconductor integrated circuit 100 or within each of the semiconductor memory devices 150A through 150X.

The self-refresh circuit 30 shown in FIG. 2 is provided to automatically refresh the memory cells included in the memory section 13. The self-refresh test control signal SLF, which is a signal indicating whether or not the memory cells in the memory section 13 should be refreshed, is input to the self-refresh circuit 30. A self-excited oscillator (not shown) is built in the self-refresh circuit 30 to output the self-refresh row address strobe signal SRAS needed in accessing a desired memory cell in the memory section 13. The self-refresh row address strobe signal SRAS is directly provided to the row address controller 14 and to the self-refresh test output terminal 122. That is to say, the self-refresh row address strobe signal SRAS is not only input to the row address controller 14 to select a memory cell on which the refresh test should be carried out, but also used to control the output of test data as will be described later.

The burn-in circuit 33 shown in FIG. 2 performs the following burn-in test functions. A "burn-in" test is a kind of accelerated test, which is carried out with a voltage exceeding a supply voltage applied to respective components within a semiconductor device. According to this embodiment, the burn-in test functions performed by the burn-in circuit 33 include: automatically and internally generating a burn-in test pattern to be applied to a DRAM, not accessing the DRAM externally; and comparing a result of the access to the DRAM to its expected value. Specifically, in carrying out a burn-in test on the memory section 13, the burn-in circuit 33 generates a burn-in test pattern by itself within the chip to access the memory section 13. Also, the circuit 33 receives the burn-in test data BIDQ, which is an output signal of the memory section 13, compares the test data BIDQ to its expected value, and then outputs the result of the comparison as a pass/fail flag MOUT. For example, the "L" level may represent "pass" and the "H" level "fail". As described above, the pass/fail flag MOUT is provided to the output terminal 123.

Responsive to a reference clock signal CLK, the burn-in circuit 33 generates row address strobe signal BIRAS, address BIADR, column address strobe signal BICAS, write enable signal BIWE and output enable signal BIOE to meet a desired timing relationship. All of these signals are needed in performing a burn-in test on the memory section 13. Among these signals for the burn-in test, the row address strobe signal BIRAS, address BIADR and column address strobe signal BICAS are provided to the row address controller 14. The address BIADR and column address strobe signal BICAS are also provided to the column address controller 17. And the write enable signal BIWE and output enable signal BIOE are provided to the control signal selector 20. That is to say, the burn-in circuit 33 accesses the memory section 13 by way of the row address controller 14, column address controller 17 and control signal selector 20. The test data is generated within the burn-in circuit 33 and then input to the memory section 13, too.

Figure 4:
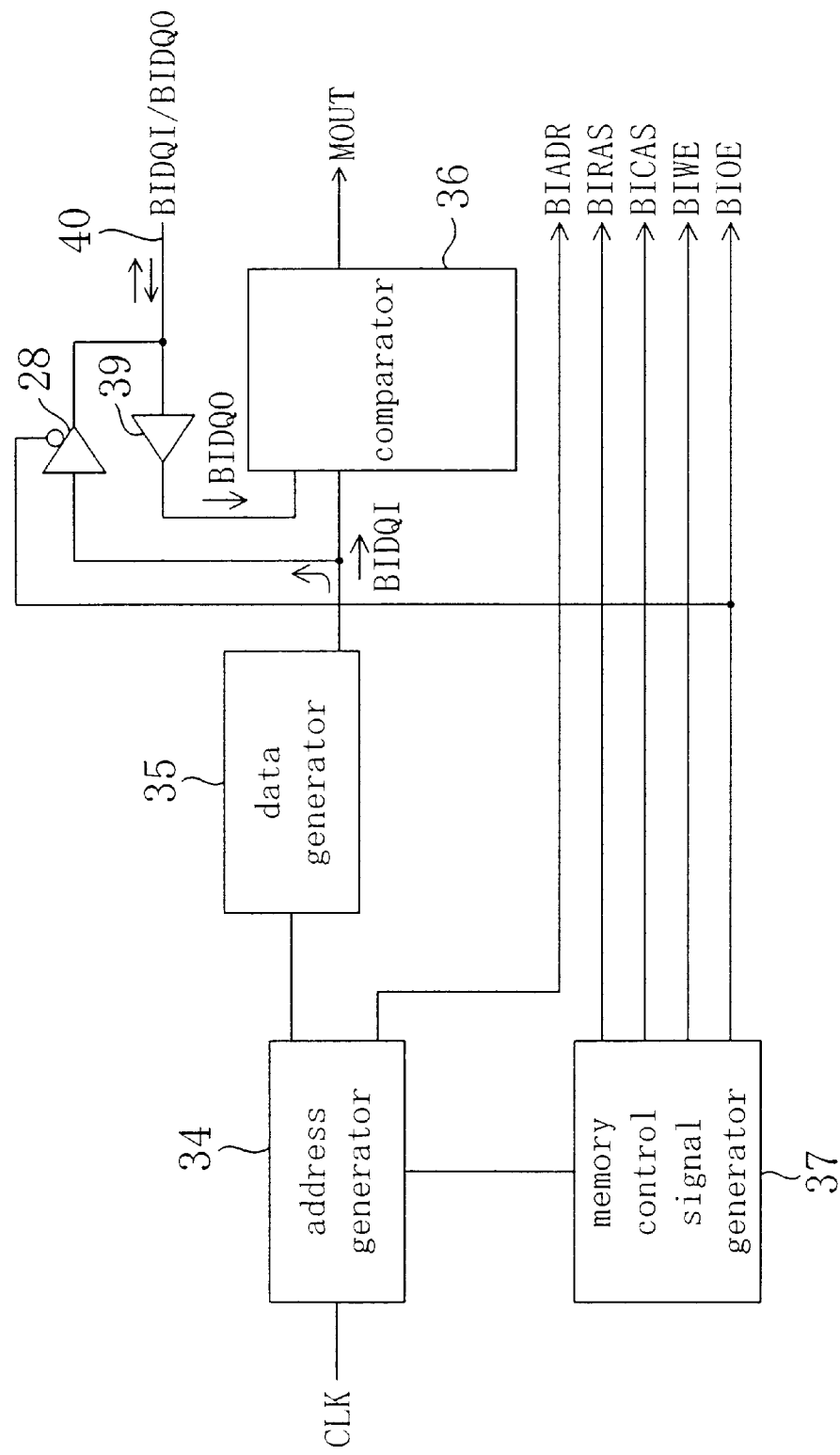
FIG. 4 is a block diagram illustrating a configuration for a burn-in circuit in the semiconductor memory device according to the present invention.
Figure 5:
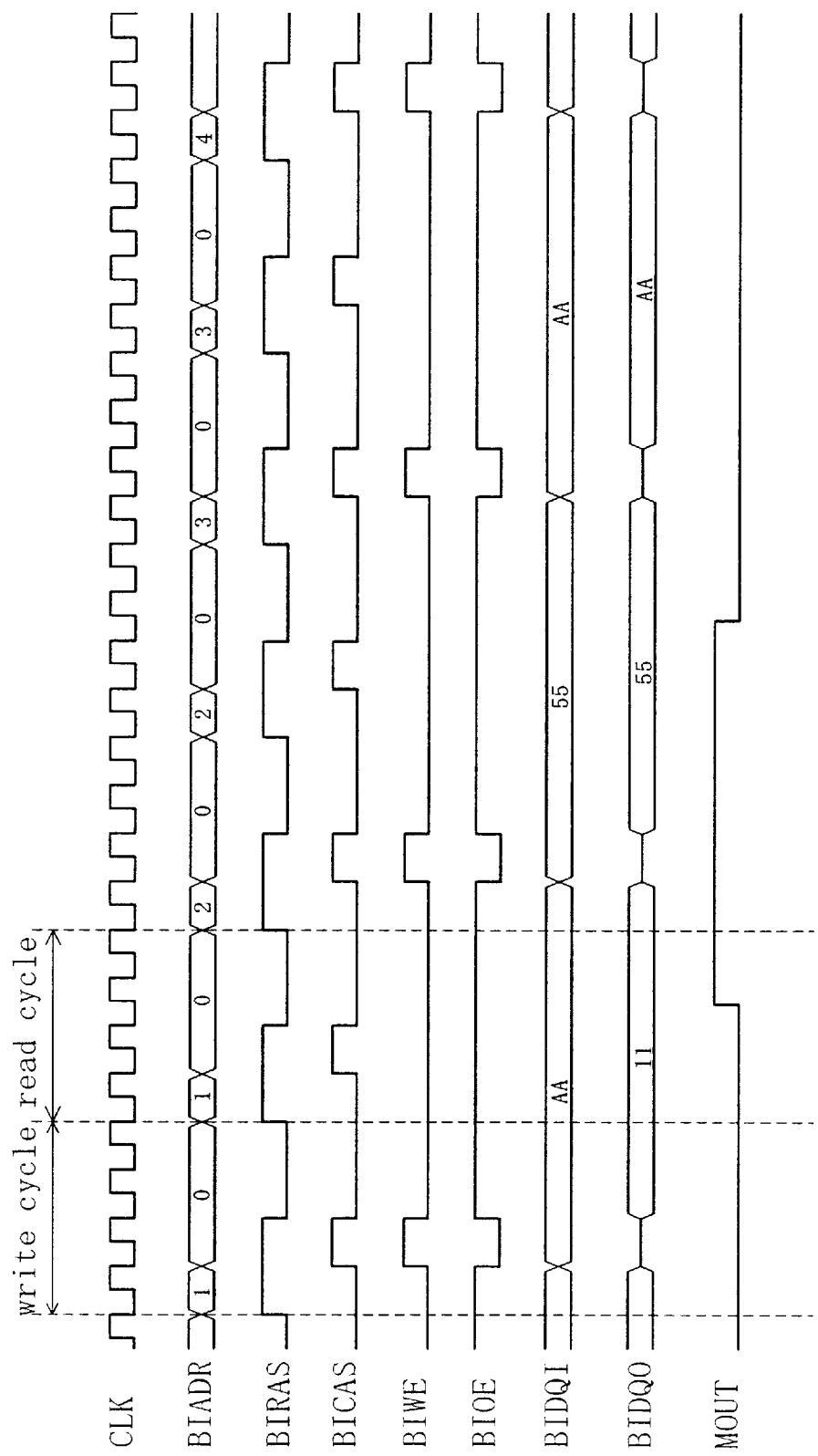
FIG. 5 is a timing diagram illustrating level transitions of respective signals for the burn-in circuit in the semiconductor memory device according to the present invention.

FIG. 4 illustrates an exemplary configuration for the burn-in circuit 33, while FIG. 5 illustrates level transitions of respective signals with time.

As shown in FIG. 4, the burn-in circuit 33 includes an address generator 34, which is implementable as a counter for counting the number of pulses of the clock signal CLK supplied, thereby generating address data. The address data is provided as the burn-in test address BIADR to the address controller 14 and row address controller 17 at respective times shown in FIG. 5. The address data generated by the address generator 34 is also provided to a memory control signal generator 37 and a data generator 35. Responsive to the output signal of the counter in the address generator 34, the signal generator 37 generates the burn-in test row address strobe signal BIRAS, address BIADR, column address strobe signal BICAS, write enable signal BIWE and output enable signal BIOE to meet the timing relationship in FIG. 5. Also, responsive to the output signal of the counter in the address generator 34, the data generator 35 generates burn-in test input data BIDQI to meet the timing relationship shown in FIG. 5. The input data BIDQI is provided to a buffer 38 and a comparator 36. The buffer 38 is controlled by the write enable signal BIWE provided from the memory control signal generator 37 to supply the input data BIDQI to the memory section 13 shown in FIG. 2 through a bidirectional bus 40. The burn-in test output data is fed back from the memory section 13 to a buffer 39 through the bidirectional bus 40 and then output as test data BIDQO from the buffer 39. In FIG. 5, "55", "AA" and "11" represent the data values of the input data BIDQI and the test data BIDQO. The comparator 36 compares the burn-in test data BIDQO, which has been output from the memory section 13, to the burn-in test input data BIDQI in read cycles shown in FIG. 5. If the comparator 36 has found these data values the same, then the comparator 36 outputs an "L"-level pass/fail flag MOUT. Otherwise, the comparator 36 outputs an "H"-level pass/fail flag MOUT.

By providing the burn-in circuit 33 with such a configuration, external peripheral circuits for use in a burn-in test can be simplified compared to directly accessing and operating the memory section 13 externally. In addition, when a plurality of memory devices are integrated together on the same chip, results of the burn-in tests can be monitored. In a hybrid system also including logic circuits such as microcontrollers, those logic circuits can also be subjected to the burn-in test in parallel, thus shortening the time taken to perform the burn-in tests.

The test decoder 42 shown in FIG. 2 receives and decodes the test mode control signal TMODE and outputs a test signal. In the illustrated example, only the burn-in test mode is necessary for the circuits within the semiconductor memory device 150 shown in FIG. 2. Thus, just the burn-in test mode signal BITST is illustrated in FIG. 2. Optionally, the test decoder 42 may also generate any other test signal. The burn-in test mode signal BITST is not only provided to the row and column address controllers 14 and 17 and control signal selector 20, but also output through the signal line 44 and output terminal 124 to external components outside of the semiconductor memory device 150. Then, the burn-in test mode signal BITST is used as a signal controlling the output of the pass/fail flag MOUT from the output selector 160 as will be described later.

Figure 6:
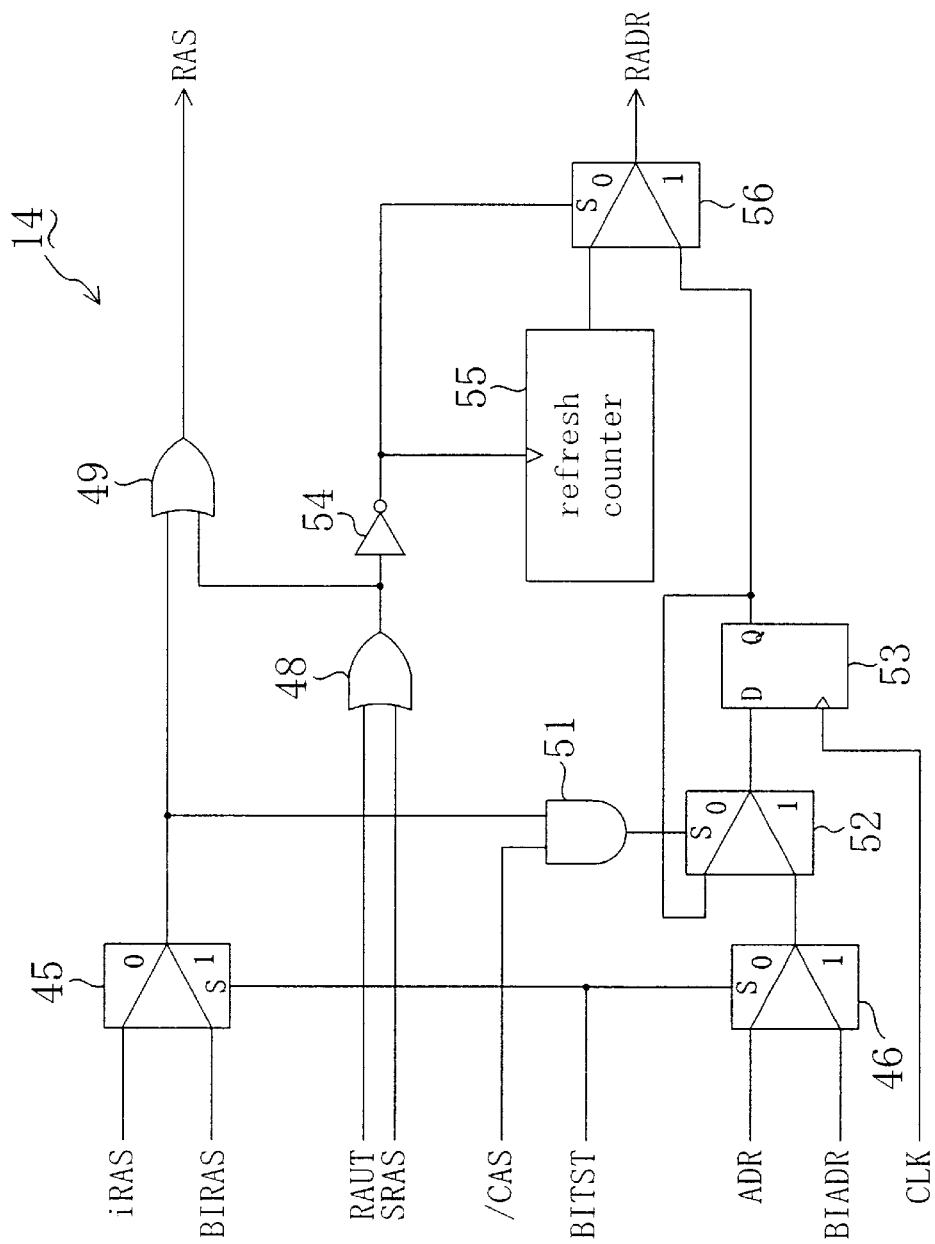
FIG. 6 is an electric circuit diagram illustrating a configuration for a row address controller in the semiconductor memory device according to the present invention.

FIG. 6 illustrates an exemplary specific configuration for the row address controller 14. As shown in FIG. 6, the row address controller 14 includes first and second selectors 45 and 46. When the burn-in test mode signal BITST is at the "L" level, the first selector 45 passes the internal RAS signal iRAS. Alternatively, when the burn-in test mode signal BITST is at the "H" level, the first selector 45 passes the burn-in test row address strobe signal BIRAS. When the burn-in test mode signal BITST is at the "L" level, the second selector 46 outputs the externally input address ADR. Alternatively, when the burn-in test mode signal BITST is at the "H" level, the second selector 46 outputs the burn-in test address BIADR. That is to say, the first selector 45 selectively outputs either the burn-in test row address strobe signal BIRAS or the normally input internal RAS signal iRAS. The second selector 46 selectively outputs either the burn-in test address BIADR or the externally input address ADR. The row address controller 14 further includes first and second OR gates 48, 49, AND gate 51, third selector 52 and D flip-flop 53. The first OR gate 48 receives the self-refresh row address strobe signal SRAS and internal auto refresh signal RAUT to output a result of the OR logical operation. The second OR gate 49 receives the output signal of the first OR gate 48 and the internal RAS signal iRAS that has passed through the first selector 45 to output a result of the OR logical operation as the row address strobe signal RAS. The AND gate 51 receives the output signal of the first selector 45 and an externally input inverted column address strobe signal /CAS to output a result of the AND logical operation. The third selector 52 receives the output signal of the AND gate 51 as a select signal and passes either the output signal of the D flip-flop 53 or that of the second selector 46. In a row active period during which the burn-in test row address strobe signal BIRAS or internal RAS signal iRAS and the external column address strobe signal /CAS are at the "H" level, the associated address (i.e., the burn-in test address BIADR or address ADR) is output from the D flip-flop 53. That is to say, the address for the row active period (i.e., a row address) is determined at this stage.

The row address controller 14 further includes inverter 54, refresh counter 55 and fourth selector 56. The output signal of the first OR gate 48 is input to the inverter 54 and then used as a clock signal for the refresh counter 55. The output signal of the refresh counter 55 is input to the fourth selector 56. The fourth selector 56 also receives the output signal of the inverter 54 as a select signal, and passes either the output signal of the D flip-flop 53 or that of the refresh counter 55 and outputs the signal as the row address RADR. That is to say, the output signal of the refresh counter 55 is used as the row address RADR applicable to both auto refresh and self-refresh.

As can be seen, the row address controller 14 extracts the address for the row active period from the externally input address and then outputs the address as the row address RADR while the refresh operation is not performed. On the other hand, while the automatic or self-refresh is being performed, the row address controller 14 provides the output data of the refresh counter 55 as the row address RADR. And the row address controller 14 finally outputs the asserted one of the row address strobe signals iRAS or SRAS as the row address strobe signal RAS.

Figure 7:
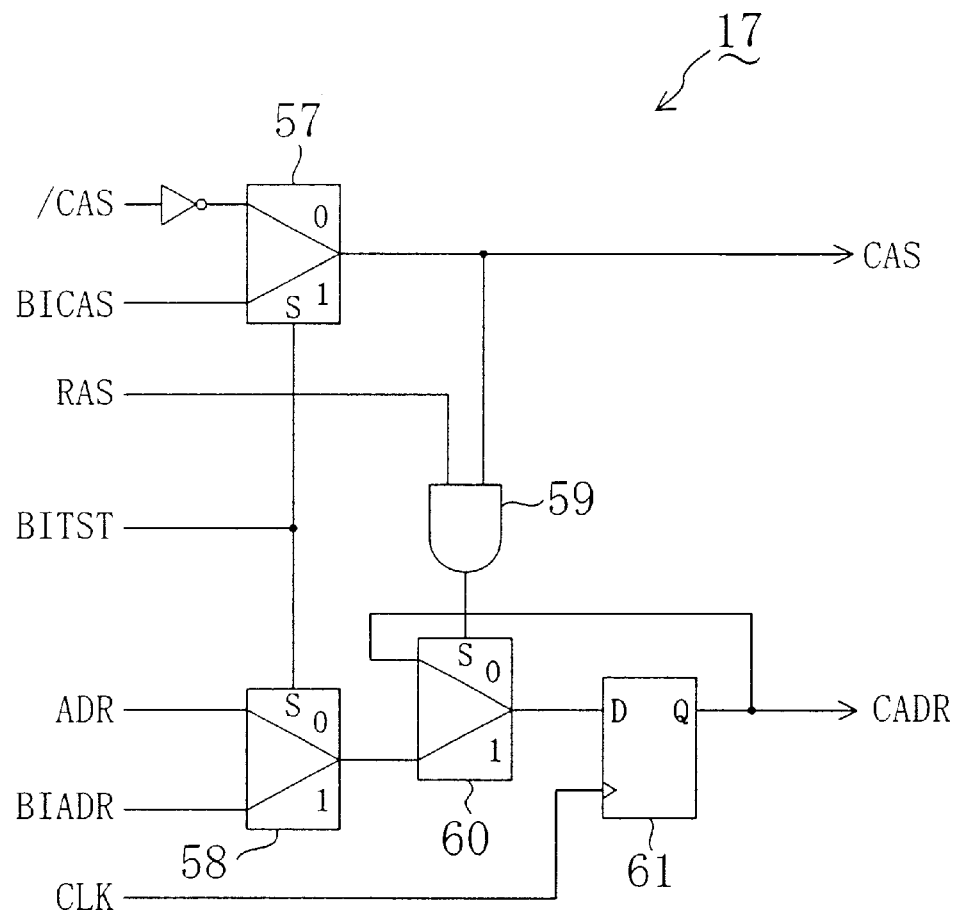
FIG. 7 is an electric circuit diagram illustrating a configuration for a column address controller in the semiconductor memory device according to the present invention.

FIG. 7 illustrates an exemplary specific configuration of the column address controller 17. As shown in FIG. 7, the column address controller 17 includes inverter and first and second selectors 57 and 58. The inverter inverts an externally input column address strobe signal /CAS. When the burn-in test mode signal BITST is at the "L" level, the first selector 57 passes the inverted version of the inverted column address strobe signal /CAS. Alternatively, when the burn-in test mode signal BITST is at the "H" level, the first selector 57 passes the burn-in test column address strobe signal BICAS. When the burn-in test mode signal BITST is at the "L" level, the second selector 58 passes the externally input address ADR. Alternatively, when the burn-in test mode signal BITST is at the "H" level, the second selector 58 passes the burn-in test address BIADR. That is to say, the first and second selectors 57 and 58 selectively output either the burn-in test data or the normally input data responsive to the burn-in test mode signal BITST. The column address controller 17 further includes AND gate 59, third selector 60 and D flip-flop 61. The AND gate 59 receives the output signal of the first selector 57 and an externally input row address strobe signal RAS to output a result of the AND logical operation. The third selector 60 receives the output signal of the AND gate 59 as a select signal and passes either the output signal of the D flip-flop 61 or that of the second selector 58. In a column active period during which the burn-in test column address strobe signal BICAS or the inverted version of the inverted column address strobe signal /CAS and the row address strobe signal RAS are at the "H" level, the associated address (i.e., the burn-in test address BIADR or address ADR) is output from the D flip-flop 61. That is to say, the address for the column active period (i.e., column address) is determined at this stage.

In the semiconductor memory device 150 shown in FIG. 2, the output signal of the D flip-flop 61 is input as the column address CADR to the memory section 13. On the other hand, the output signal of the first selector 57 is input as the column address strobe signal CAS to the memory section 13. As can be seen, the column address controller 17 outputs the extracted address strobe signal CAS. In other words, the controller 17 outputs the burn-in test column address strobe signal BICAS or the inverted version of the externally input column address strobe signal /CAS as the column address strobe signal CAS.

Figure 8:
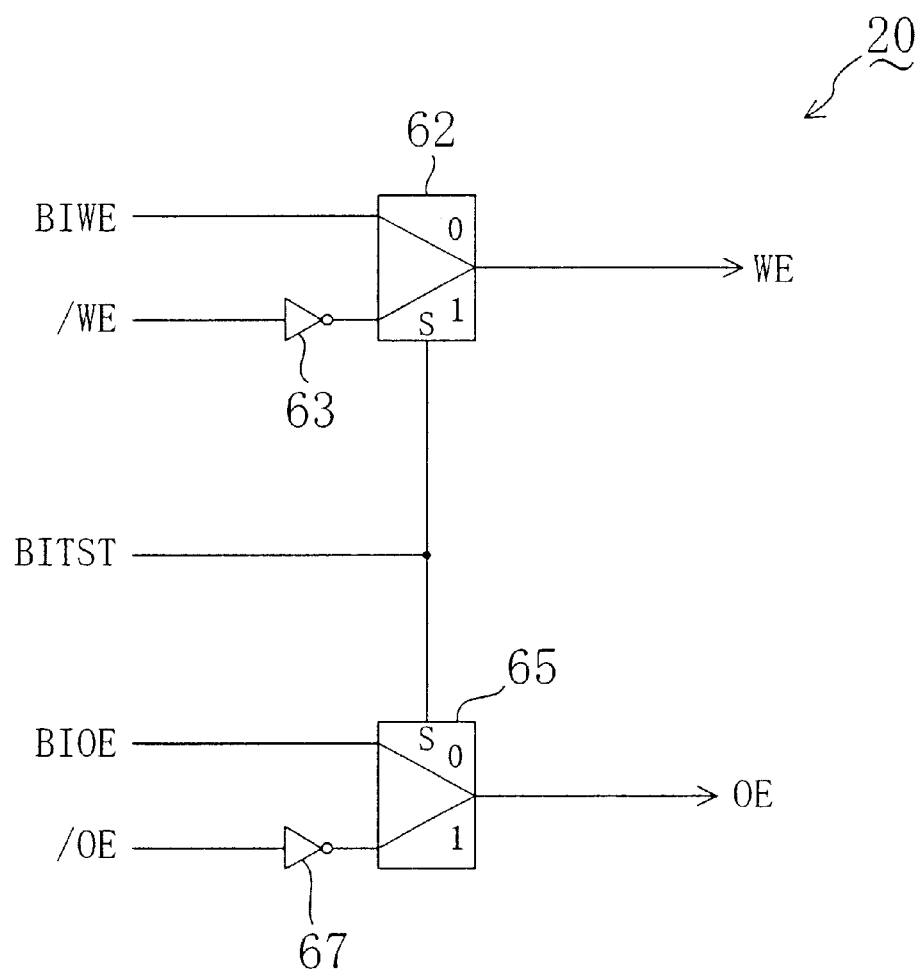
FIG. 8 is an electric circuit diagram illustrating a configuration for a control signal selector in the semiconductor memory device according to the present invention.

FIG. 8 illustrates an exemplary specific configuration for the control signal selector 20. As shown in FIG. 8, the control signal selector 20 includes inverters 63, 67 and first and second selectors 62, 65. An externally input inverted write enable signal /WE is inverted by the inverter 63 and then provided to the first selector 62. When the burn-in test mode signal BITST is at the "L" level, the first selector 62 passes the inverted version of the inverted write enable signal /WE. Alternatively, when the burn-in test mode signal BITST is at the "H" level, the first selector 62 passes the burn-in test write enable signal BIWE. An externally input inverted output enable signal /OE is inverted by the inverter 67 and then provided to the second selector 65. When the burn-in test mode signal BITST is at the "L" level, the second selector 65 passes the inverted version of the inverted output enable signal /OE. Alternatively, when the burn-in test mode signal BITST is at the "H" level, the second selector 65 passes the burn-in test output enable signal BIOE. And the output signals of the first and second selectors 62 and 65 are provided as the write enable signal WE and the output enable signal OE, respectively.

As can be seen, the control signal selector 20 selects either the burn-in test data or normally input data and then provides the write and output enable signals WE and OE to the memory section 13.

As shown in FIG. 2, the semiconductor memory device 150 further includes the bus hold circuit 66. The bus hold circuit 66 is provided for holding the test bus 141 to prevent a feedthrough current from flowing even when the test bus 141 is not used and floating during the normal operation of the semiconductor memory devices 150A through 150X integrated on the same chip. This is a third main feature of the semiconductor integrated circuit 100 according to the present invention.

Figure 9:
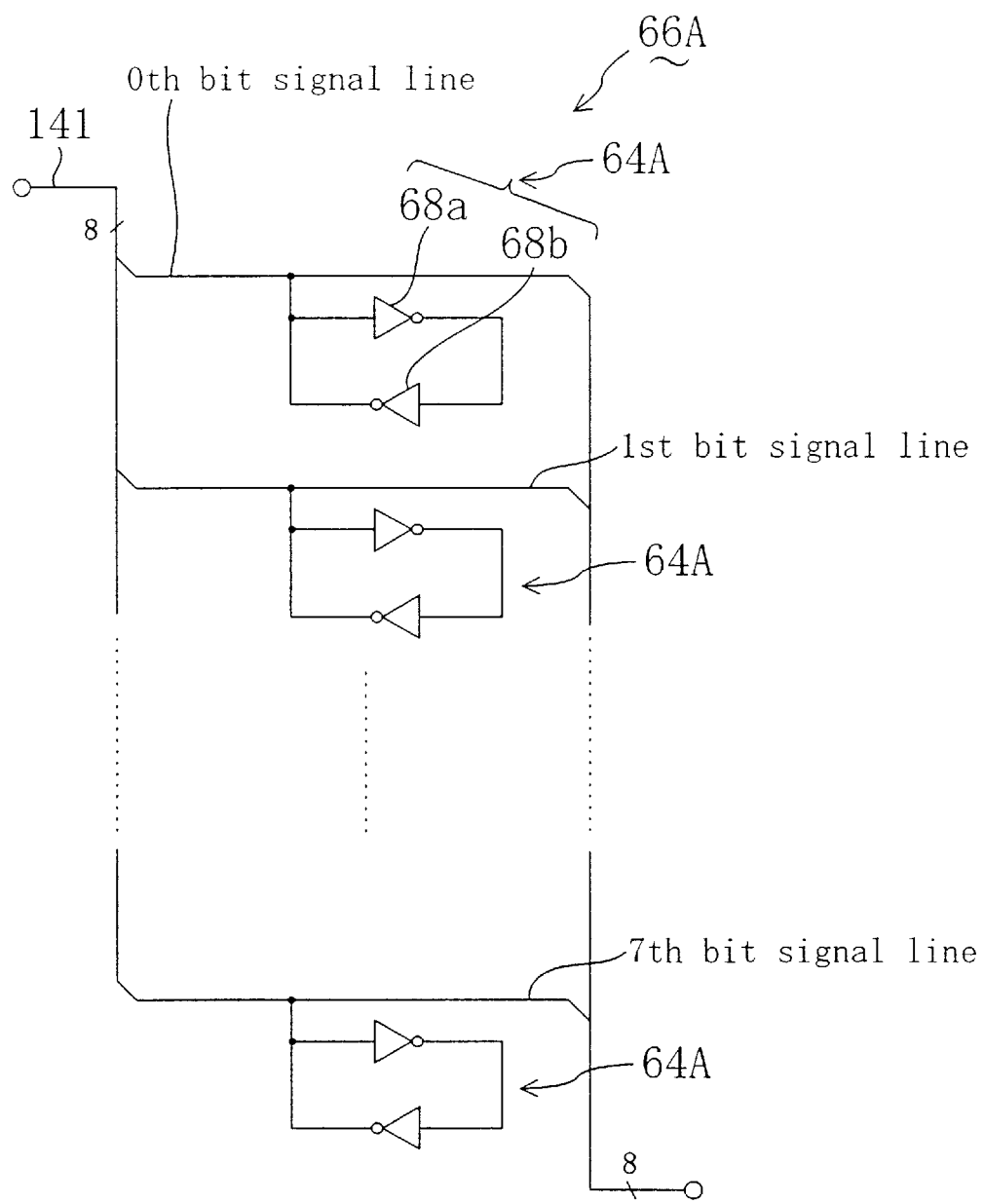
FIG. 9 is an electric circuit diagram illustrating a configuration for a bus hold circuit in the semiconductor memory device according to the present invention.

FIG. 9 illustrates an exemplary specific configuration for the bus hold circuit 66 shown in FIG. 2. As shown in FIG. 9, the bus hold circuit 66A includes a plurality of partial hold circuits 64A. Each of the partial hold circuits 64A forms a closed loop where the output signal of a first inverter 68a is input to a second inverter 68b and the output signal of the second inverter 68b is fed back to the first inverter 68a. These partial hold circuits 64A are connected to respective signal lines of the test bus 141 that are associated with the $0^{th}$, $1^{st}$, $2^{nd}$, $3^{rd}$, $4^{th}$, $5^{th}$, $6^{th}$ and $7^{th}$ bits of the test data to be output. In this configuration, if "H" or "L"-level data is initially input, then the input data will be held as it is between the first and second inverters 68a and 68b forming a closed loop. That is to say, the test bus 141 does not get floating.

If the (current) output ability of each inverter 68a, 68b is too high, then the data once input might not be replaced with data newly input to the test bus 141. Thus, the partial hold circuits 64A associated with just one of the semiconductor memory devices 150A through 150X on the same chip may be enabled. Alternatively, the partial hold circuits 64A associated with several ones of the semiconductor memory devices 150A through 150X on the same chip that have been selected in accordance with the output abilities of the inverters 68a and 68b and the memory section 13 may be enabled. In any case, the remaining partial hold circuits 64A may be disconnected from the test bus 141.

Figure 10:
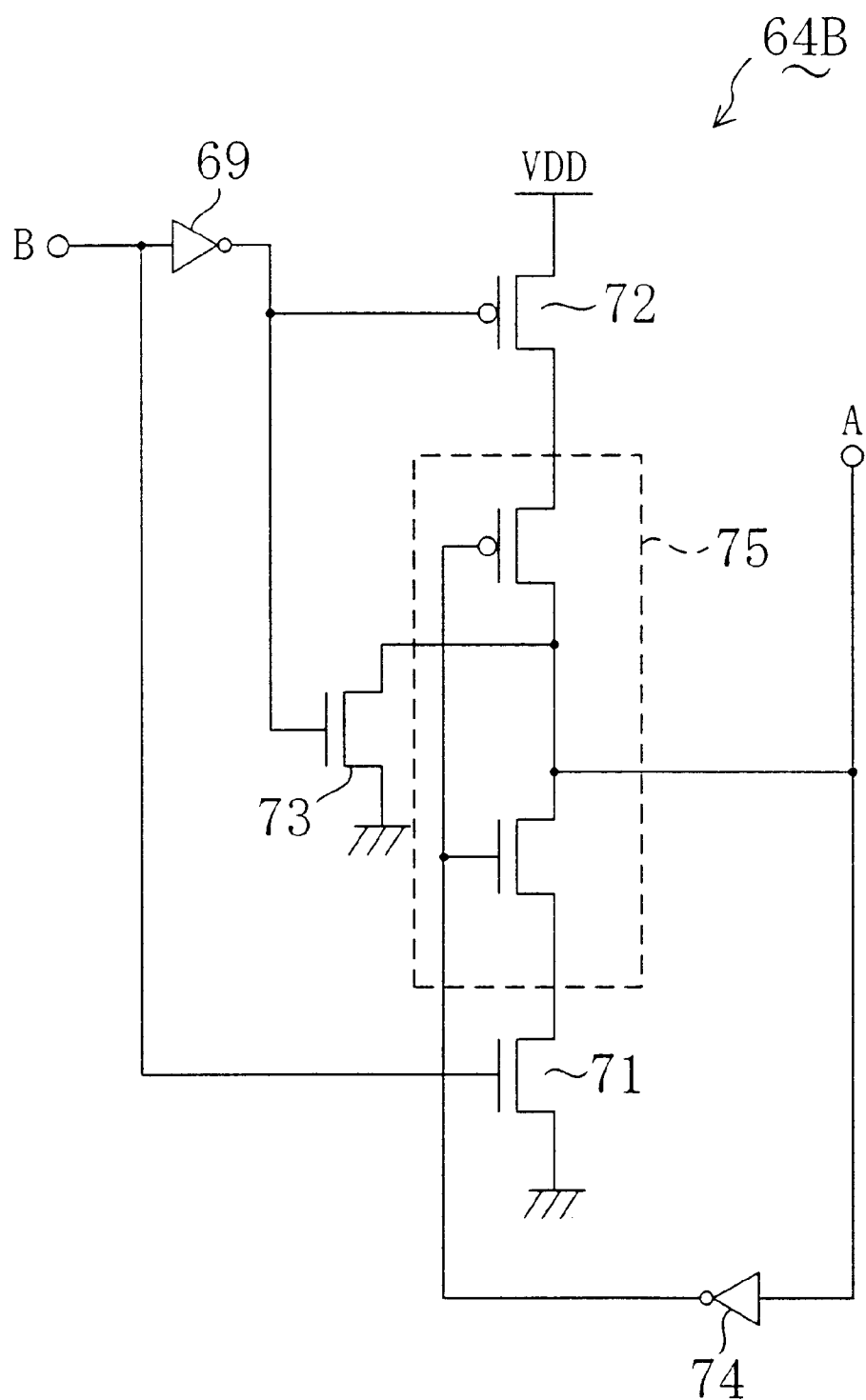
FIG. 10 is an electric circuit diagram illustrating a configuration for a partial hold circuit provided for a pull-down bus hold circuit in the semiconductor memory device according to the present invention.
Figure 11:
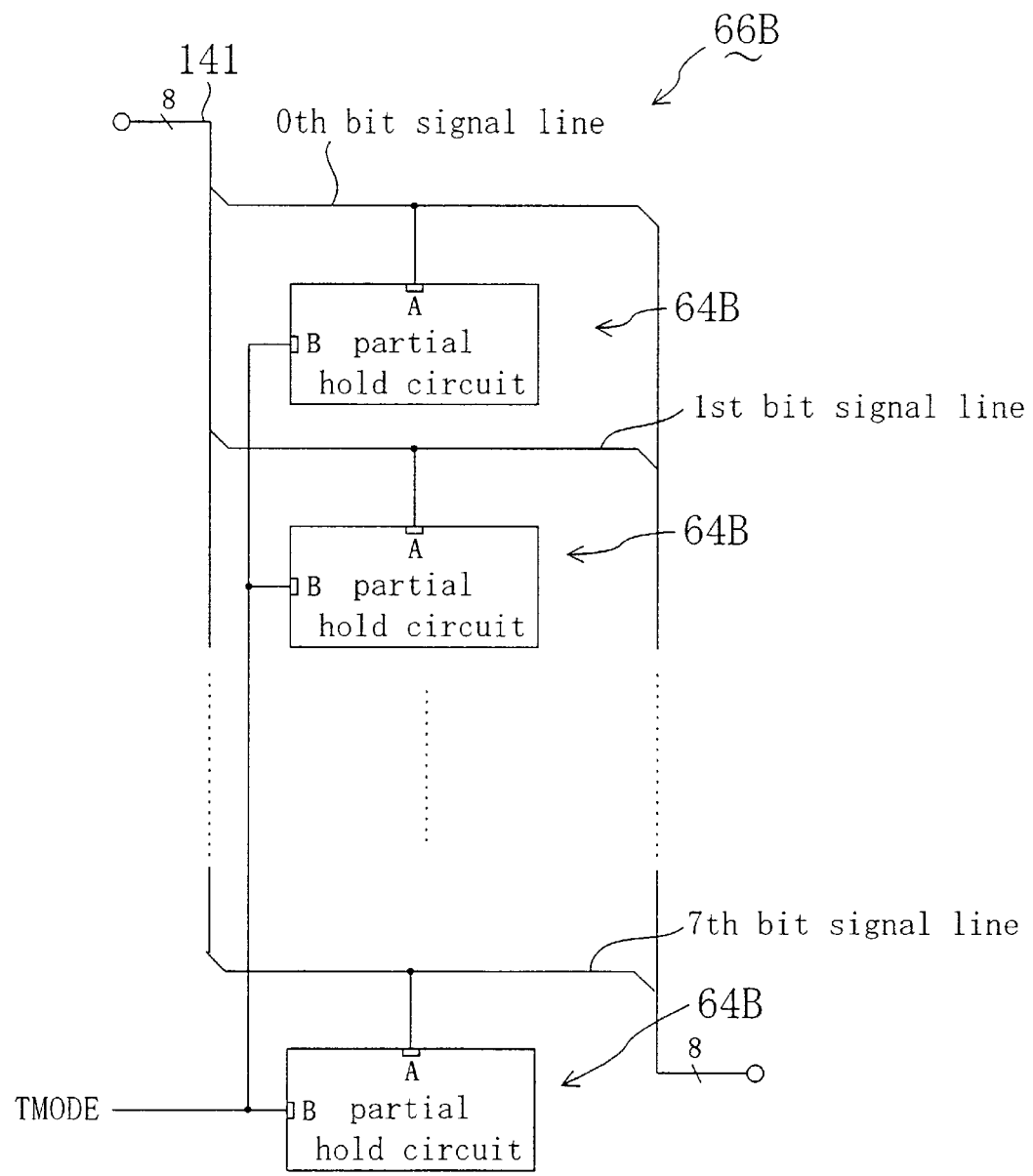
FIG. 11 is an electric circuit diagram illustrating a configuration for the pull-down bus hold circuit in the semiconductor memory device according to the present invention.

FIG. 11 illustrates another specific configuration for the bus hold circuit 66 shown in FIG. 2. The bus hold circuit 66B with a pull-down function shown in FIG. 11 includes a plurality of pull-down partial hold circuits 64B shown in FIG. 10, instead of the partial hold circuits 64A shown in FIG. 9. FIG. 10 illustrates an exemplary specific configuration for the pull-down partial hold circuit 64B.

As shown in FIG. 11, each of the $0^{th}$ through $7^{th}$ bit signal lines of the test bus 141 is provided with the partial hold circuit 64B, which includes terminals A and B. The terminal A is connected to one of the signal lines of the test bus 141, which is associated with the partial hold circuit 64B. On the other hand, the terminal B receives the test mode control signal TMODE.

In the partial hold circuit 64B shown in FIG. 10, when the data input through the terminal B to a first inverter 69 rises to the "H" level, the output data of the first inverter 69 is at the "L" level. As a result, a first n-channel transistor 71 and a p-channel transistor 72 both turn ON, while a second n-channel transistor 73 turns OFF. The relationship between a second inverter 74 and a composite transistor 75 (forming another inverter) is equivalent to the 15 relationship between the inverters 68a and 68b shown in FIG. 9. However, when the data input to the first inverter 69 falls to the "L" level, the output data of the first inverter 69 is at the "H" level. As a result, the first n-channel transistor 71 and the p-channel transistor 72 both turn OFF, while the second n-channel transistor 73 turns ON. Consequently, the data provided to the terminal A is fixed at the "L" level. That is to say, by controlling the input data using the pull-down partial hold circuit 64B shown in FIG. 10, a particular one or all of the non-used bits in the test bus can be fixed at the "L" level. Thus, it is possible to prevent the test bus from getting floating effectively.

Figure 12:
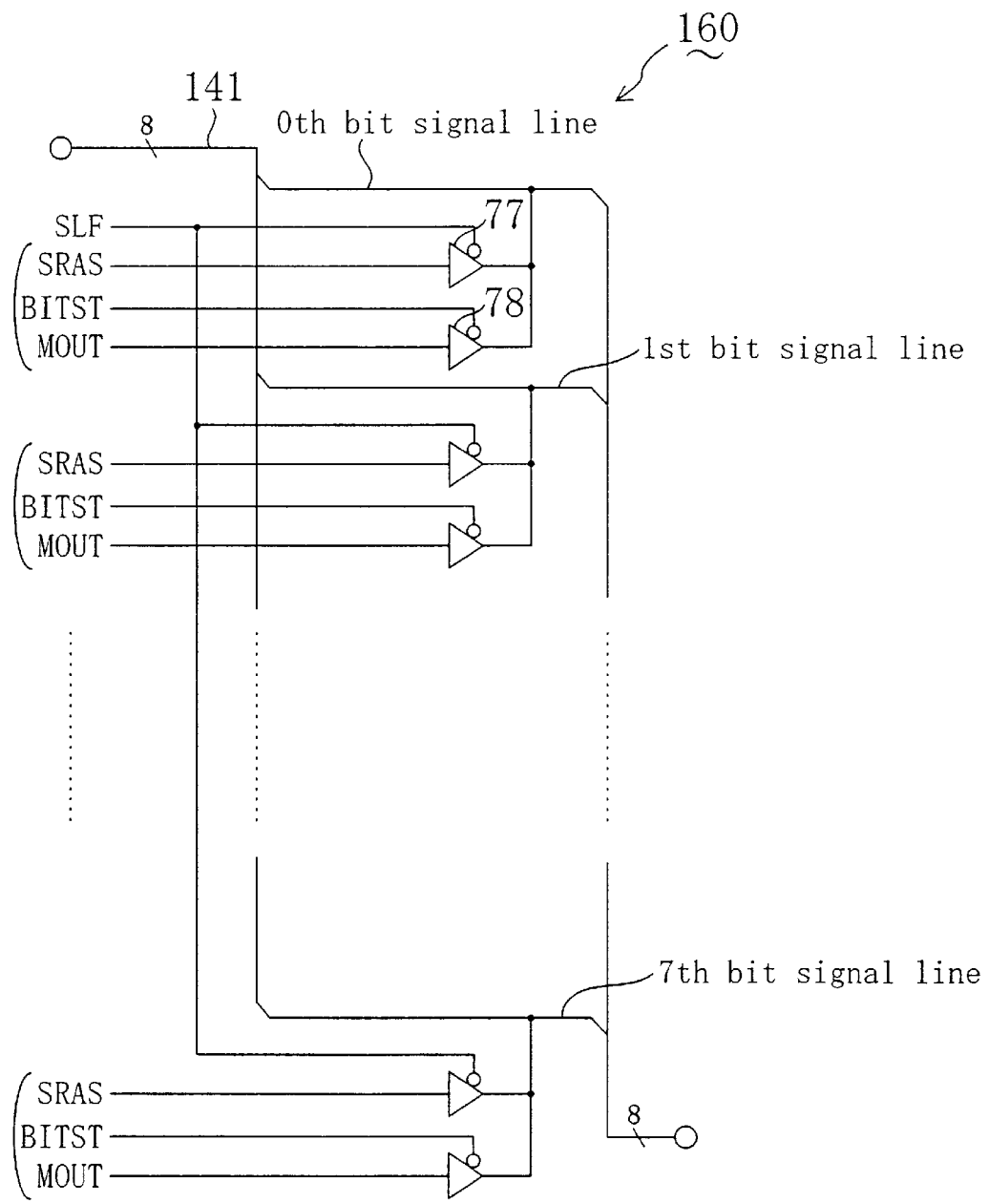
FIG. 12 is an electric circuit diagram illustrating a configuration for an output selector in the semiconductor memory device according to the present invention.

FIG. 12 illustrates an exemplary specific configuration for the output selector 160 shown in FIG. 1.

As shown in FIG. 12, each of the $0^{th}$ through $7^{th}$ bit signal lines includes first and second output buffers 77 and 78, each of which includes an associated output control terminal.

The first output buffer 77 receives the self-refresh row address strobe signal SRAS of the associated semiconductor memory device 150 as an input signal and the self-refresh test control signal SLF as an output control signal. The second output buffer 78 receives the pass/fail flag MOUT as an input signal and the burn-in test mode signal BITST as an output control signal. Each pair of output buffers 77 and 78 is provided for an associated one of the semiconductor memory devices 150A through 150X shown in FIG. 1.

By providing such an output selector 160, when eight or less semiconductor memory devices are integrated on the same chip, the self-refresh circuit can be tested and the burn-in test can be carried out without increasing the number of output pins (or external terminals). In the foregoing embodiment, the bit width of the test bus 141 is 8 bits. If the number of bits associated with the test bus 141 is increased to shorten the time taken to perform a test, then a larger number of semiconductor memory devices can be integrated on the same chip without increasing the number of output pins (or external terminals).

It is noted that the hold circuit 66 may be provided either on the preceding or succeeding stage of the output selector 160.

What is claimed is:

1. A semiconductor device comprising:
   a plurality of DRAMs and logic circuits integrated together on a single semiconductor substrate, each said DRAM including a plurality of memory cells and internally generating a pass/fail flag signal representing a test result;
   a data bus for inputting or outputting data to/from the DRAMs therethrough; and
   means for selectively outputting the pass/fail flag signal to the data bus.

2. A semiconductor device comprising:
   a plurality of DRAMs and logic circuits integrated together on a single semiconductor substrate, each said DRAM including a plurality of memory cells and internally generating a pass/fail flag signal representing a test result;

a data bus for inputting or outputting data to/from the DRAMs therethrough; and means for selectively outputting the pass/fail flag signal to the data bus;

wherein the pass/fail flag signal represents a result of a burn-in test.

3. A semiconductor device comprising:

a plurality of DRAMs and logic circuits integrated together on a single semiconductor substrate, each said DRAM including a plurality of memory cells and internally generating a pass/fail flag signal representing a test result;

a data bus for inputting or outputting data to/from the DRAMs therethrough; and means for selectively outputting the pass/fail flag signal to the data bus;

wherein the data bus is connected in common to the DRAMs, and wherein the outputting means outputs the pass/fail flag signal associated with one of the DRAMs through a one-bit-equivalent signal line of the data bus.

4. A semiconductor device comprising:

a plurality of memory blocks and logic circuits integrated together on a single semiconductor substrate, each said memory block including a plurality of memory cells and internally generating a pass/fail flag signal representing a test result of a test performed on the plurality of memory cells responsive to a test mode control signal;

a data bus coupled to the plurality of memory blocks for outputting data to be read out from the plurality of memory cells therethrough; and an output selector coupled to receive the read data and the pass/fail flag signal for selectively providing either one of the read data and the pass/fail flag signal as an output responsive to the test mode control signal.

5. A semiconductor device comprising:

a plurality of DRAMs and logic circuits integrated together on a single semiconductor substrate, each said DRAM including a plurality of memory cells and internally generating a pass/fail flag signal representing a test result;

a data bus for inputting or outputting data to/from the DRAMs therethrough; and means for selectively outputting the pass/fail flag signal to the data bus.

6. A semiconductor device according to claim 4, wherein the data bus comprises a plurality of signal lines respectively corresponding to a plurality of data bits, the output selector comprises a plurality of output terminals each corresponding to a bit of the plurality of data bits; and the output selector is configured such that respective pass/fail flag signals generated by the respective memory blocks are selectively provided to respective ones of the plurality of output terminals responsive to the test mode control signal.

* * * * *

UNITED STATES PATENT AND TRADEMARK OFFICE
CERTIFICATE OF CORRECTION

PATENT NO. : 6,654,299 B2
DATED : November 25, 2003
INVENTOR(S) : Hidefumi Otsuka et al.

It is certified that error appears in the above-identified patent and that said Letters Patent is hereby corrected as shown below:

Column 14,
Line 54, cancel "claim 1 (old claim 4)"

Signed and Sealed this

Twenty-first Day of September, 2004

JON W. DUDAS
*Director of the United States Patent and Trademark Office*